United States Patent
Park et al.

(10) Patent No.: US 9,921,476 B2
(45) Date of Patent: Mar. 20, 2018

(54) POSITIVE-TYPE PHOTOSENSITIVE RESIN COMPOSITION, AND INSULATING FILM AND OLED FORMED USING THE SAME

(71) Applicant: KOLON INDUSTRIES, INC., Gwacheon-si, Gyeonggi-do (KR)

(72) Inventors: Se Hyung Park, Seongnam-si (KR); Byoung Kee Kim, Yongin-si (KR)

(73) Assignee: KOLON INDUSTRIES, INC., Gwacheon-si (KR)

( * ) Notice: Subject to any disclaimer, the term of this patent is extended or adjusted under 35 U.S.C. 154(b) by 0 days.

(21) Appl. No.: 14/347,180

(22) PCT Filed: Sep. 24, 2012

(86) PCT No.: PCT/KR2012/007643
§ 371 (c)(1),
(2) Date: Mar. 25, 2014

(87) PCT Pub. No.: WO2013/048069
PCT Pub. Date: Apr. 4, 2013

(65) Prior Publication Data
US 2014/0234775 A1 Aug. 21, 2014

(30) Foreign Application Priority Data
Sep. 30, 2011 (KR) .......... 10-2011-0100307

(51) Int. Cl.
*G03F 7/023* (2006.01)
*G03F 7/022* (2006.01)
*G03F 7/038* (2006.01)
*H01L 51/52* (2006.01)

(52) U.S. Cl.
CPC .......... *G03F 7/0233* (2013.01); *G03F 7/0226* (2013.01); *G03F 7/0387* (2013.01); *H01L 51/5253* (2013.01)

(58) Field of Classification Search
CPC ............................ G03F 7/0226; G03F 7/0233
USPC ................................. 430/18, 191, 192, 193
See application file for complete search history.

(56) References Cited

U.S. PATENT DOCUMENTS

| 5,114,826 | A | | 5/1992 | Kwong et al. |
| 5,288,588 | A | * | 2/1994 | Yukawa ............. C08G 73/1042 430/165 |
| 5,302,489 | A | * | 4/1994 | Shu ............................. 430/191 |
| 5,753,407 | A | * | 5/1998 | Oba .................... C08G 73/1007 430/170 |
| 6,090,525 | A | | 7/2000 | Yuba et al. |
| 7,026,080 | B2 | * | 4/2006 | Nakayama et al. ............ 430/18 |
| 7,361,445 | B2 | * | 4/2008 | Banba ................... G03F 7/0048 430/18 |
| 7,629,091 | B2 | * | 12/2009 | Ishii et al. ..................... 430/18 |
| 7,851,121 | B2 | * | 12/2010 | Yamanaka et al. ........... 430/191 |
| 2001/0031419 | A1 | * | 10/2001 | Nunomura et al. .......... 430/191 |
| 2004/0048188 | A1 | | 3/2004 | Hatanaka et al. |
| 2007/0083016 | A1 | * | 4/2007 | Dueber ................... C08L 63/00 525/420 |
| 2008/0090927 | A1 | * | 4/2008 | Ishii ................... C08G 73/1039 522/47 |
| 2009/0267239 | A1 | | 10/2009 | Kanada et al. |

FOREIGN PATENT DOCUMENTS

| CN | 101630125 A | | 1/2010 |
| CN | 102099741 A | | 6/2011 |
| JP | 2005-242328 A | | 9/2005 |
| JP | 2005242328 A | * | 9/2005 |
| JP | 2010-37425 A | | 2/2010 |
| JP | 2010-61111 A | | 3/2010 |
| JP | 2010-134116 A | | 6/2010 |

OTHER PUBLICATIONS

International Searching Authority, International Search Report of PCT/KR2012/007643 dated Feb. 21, 2013.
State Intellectual Property Office of the P.R.C., Communication dated Apr. 1, 2016 issued in corresponding Application No. 201280048278.5.

* cited by examiner

*Primary Examiner* — John S Chu
(74) *Attorney, Agent, or Firm* — Sughrue Mion, PLLC

(57) ABSTRACT

This invention relates to a positive-type photosensitive resin composition which includes an alkali soluble polyimide resin, a diazide-based photosensitive compound and a sensitivity enhancer, and in which the use of a polyimide resin wherein the degree of imidization of imidized polyimide resin is 50~75% exhibits a light transmittance of 95% or more in the visible light wavelength range (400~650 nm) as well as high developability in a patterning process, and to an insulating film and an OLED formed using the same.

14 Claims, 2 Drawing Sheets

[Figure 1]
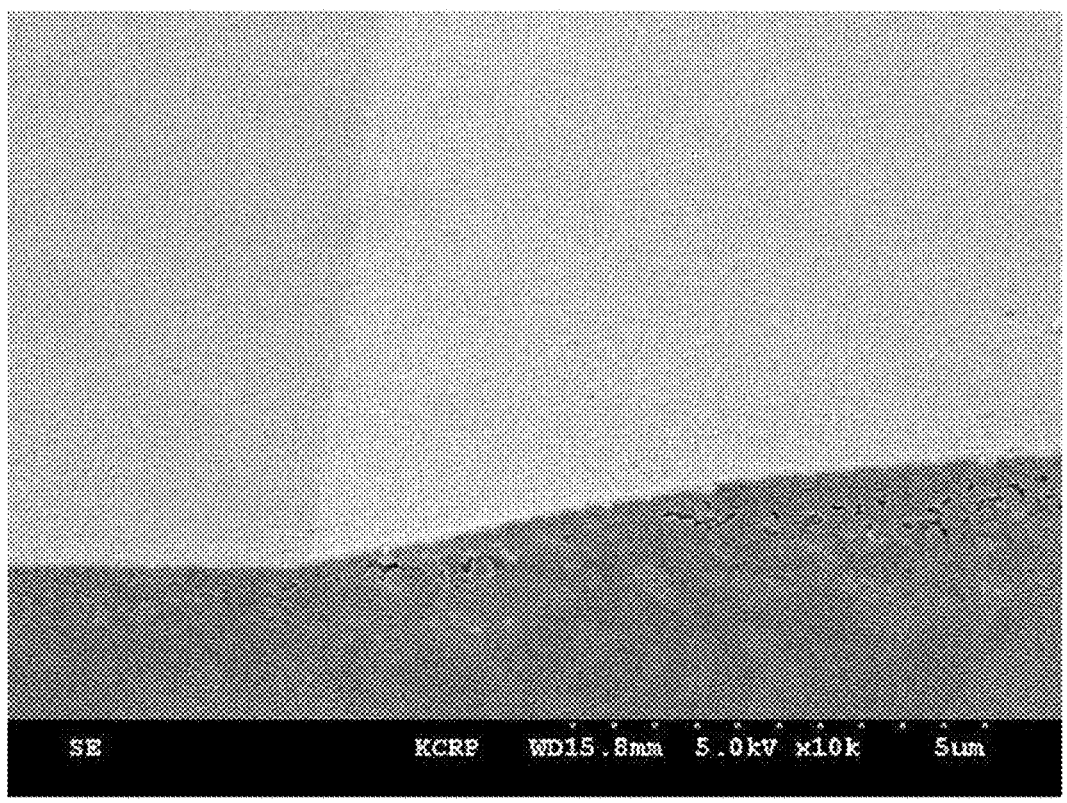

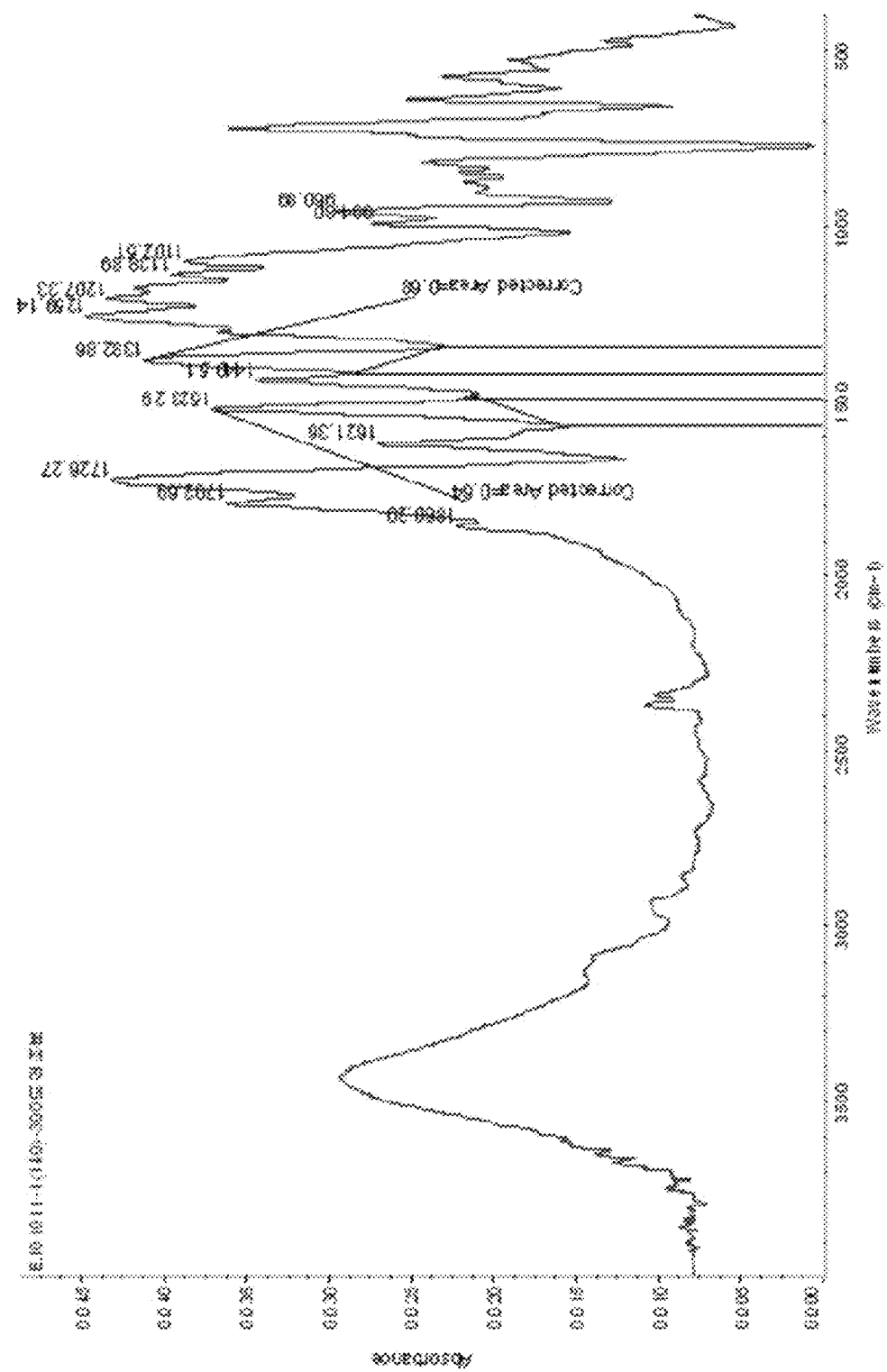
[Figure 2]

POSITIVE-TYPE PHOTOSENSITIVE RESIN COMPOSITION, AND INSULATING FILM AND OLED FORMED USING THE SAME

CROSS REFERENCE TO RELATED APPLICATIONS

This application is a National Stage of International Application No. PCT/KR2012/007643 filed Sep. 24, 2012, claiming priority based on Korean Patent Application No. 10-2011-0100307, filed Sep. 30, 2011, the contents of all of which are incorporated herein by reference in their entirety.

TECHNICAL FIELD

The present invention relates to a positive-type photosensitive resin composition, wherein in the field of flat panel displays, in particular, organic light emitting diodes (OLEDs), liquid crystal displays (LCDs), high light transmittance and the desired resolution in a patterning process may result from using a polyimide resin that exhibits superior developability, and to an insulating film and an OLED formed using the same.

BACKGROUND ART

Recently semiconductor fields require a stable material which may be easily processed and may undergo a burning process at 200° C. or higher because of the high density and high integration of devices. Particularly a polyimide resin has superior heat resistance, chemical resistance, thermal oxidation resistance, etc., and is thus widely utilized not only as an electronic material for use in electrode protecting films and so on of TFT-LCD but also in heat-resistant materials for automobiles, aircrafts, etc.

Initially, a polyimide resin was used in a simple manner by applying a photoresist thereon and then etching it to form a pattern. However, while using a photosensitive polyimide obtained by imparting a photosensitive function to polyimide itself, lithography using a photoresist may be omitted, which contributes to simplifying the process and improving productivity.

Conventional techniques related to positive photosensitive polyimide resins include for example a chemical amplification method for mixing polyamic acid with a photoacid generator which is a photosensitive functional group, a method of mixing polyamic acid with a dissolution inhibitor such as naphtoquinonediazide, a method of mixing soluble polyimide with naphtoquinonediazide, etc. However, such conventional techniques are problematic because the reliability of cured devices may decrease, and it is difficult to obtain a high-resolution pattern, and properties may deteriorate due to the use of a large amount of photosensitive agent.

Also a polyimide resin intrinsically has high aromatic ring density and thus has a yellow color, and undesirably exhibits low transmittance in the visible light range and so has decreased light transmittance.

Typically a polyimide resin is prepared by polymerizing an aromatic diamine and an aromatic dianhydride, thus obtaining a polyamic acid derivative which is then ring-closed and dehydrated at high temperature and imidized. To produce a polyimide resin, the aromatic diamines include oxydianiline (ODA), m-phenylene diamine (m-PDA), bisaminophenyl hexafluoropropane (HFDA), methylenedianiline (MDA), etc., and the aromatic dianhydride includes pyromellitic dianhydride (PMDA), biphenyltetracarboxylic dianhydride (BPDA), oxydiphthalic dianhydride (ODPA), etc.

On the other hand, an organic light emitting diode is a display which is configured such that a thin film is formed between two electrodes using an organic light emitting material, and current is applied to both electrodes, whereby electrons and holes which are carriers are injected into an organic thin film layer at the anode and cathode so that these carriers are recombined to generate energy which is then emitted in the form of light. This uses properties in which an organic material emits light when voltage is applied thereto, and color tones are represented using properties according to which red, green and blue colors are given off depending on the kind of organic material.

The OLED is manufactured by for example coating a transparent substrate having indium thin oxide (ITO) or the like as a transparent electrode deposited thereon with a photoresist, performing photoexposure, developing, etching and stripping, thus forming a pattern, forming an insulating layer thereon using a photoresist, and then forming a barrier on the insulating layer pattern. Then, an organic thin film is deposited in the order of an electron injection layer, an electron transport layer, a light emitting layer, a hole transport layer and a hole injection layer, after which a metal electrode layer is deposited thereon. Finally, sealing is performed using a sealant and a module is then assembled, thereby completing an OLED.

The insulating layer patterning process as described above is performed by uniformly applying a liquid positive-type photosensitive resin composition over the entire surface of a substrate using spin coating, and then conducting prebaking and photo exposure to form a circuit. To prevent deterioration of ITO edges and upper and lower shorts, an insulating layer having a thickness of 1000~1200 Å is formed.

The insulating layer includes an inorganic insulating film or an organic insulating film. The inorganic insulating film material may include one or more selected from among $SiO_2$, $SiN_x$ and so on.

Not only the inorganic insulating film but also the organic insulating film such as an imide based polymer or an acrylic polymer may be formed using an insulative photosensitive resin composition, but it is not easy to ensure a process margin due to partial residue generation or the like in the process and it is difficult to apply to a highly sensitive pattern. Also, the conventional polyimide resulting from a diamine and a dianhydride intrinsically has a brown color, and is thus can only improve the light transmittance to a limited extent.

Hence, there is a need for a photosensitive resin composition which is capable of forming a highly sensitive circuit without residue generation in a developing process, improving the color of conventional polyimide to increase light transmittance, and ensuring insulation resistance.

DISCLOSURE

Technical Problem

Accordingly, the present invention has been made keeping in mind the above problems occurring in the related art, and an object of the present invention is to provide a positive-type photosensitive resin composition which may exhibit a light transmittance of 95% or more in the visible light wavelength range (400~650 nm) as well as high developability in a patterning process, and an insulating film and an OLED formed therefrom.

Technical Solution

An embodiment of the present invention provides a positive-type photosensitive resin composition comprising an alkali soluble resin, a diazide-based photosensitive compound and a sensitivity enhancer, wherein the alkali soluble resin is a polyimide resin having a degree of imidization (DI) of 50~75%.

In the embodiment of the invention, the polyimide resin may be prepared by imidizing a polyamic acid solution having a viscosity of 100~700 cps.

In the embodiment of the invention, the polyimide resin may have a weight average molecular weight (based on GPC (Gel Permeation Chromatography) measurement) of 40,000~80,000 g/mol.

In the embodiment of the invention, the polyimide resin may be prepared by polymerizing an aromatic diamine and an aromatic dianhydride using a first solvent, thus obtaining a polyamic acid solution, imidizing the polyamic acid solution using a chemical curing agent and an imidization catalyst thus obtaining an imidized solution, adding the imidized solution to a second solvent, and performing filtration and drying.

In the embodiment of the invention, the aromatic diamine may comprise one or more selected from among 2,2-bis(3-amino-4-hydroxyphenyl)-hexafluoropropane (Bis-AP-AF), 2,2-bis[4-(4-aminophenoxy)-phenyl]propane (6HMDA), 2,2'-bis(trifluoromethyl)-4,4'-diaminobiphenyl (2,2'-TFDB), 3,3'-bis(trifluoromethyl)-4,4'-diaminobiphenyl (3,3'-TFDB), 4,4'-bis(3-aminophenoxy)diphenylsulfone (DBSDA), bis(3-aminophenyl)sulfone (3DDS), bis(4-aminophenyl)sulfone (4DDS), 1,3-bis(3-aminophenoxy)benzene (APB-133), 1,4-bis(4-aminophenoxy)benzene (APB-134), 2,2'-bis[3-(3-aminophenoxy)phenyl]hexafluoropropane (3-BDAF), 2,2'-bis[4(4-aminophenoxy)phenyl]hexafluoropropane (4-BDAF) and oxydianiline (ODA).

In the embodiment of the invention, the aromatic dianhydride may comprise one or more selected from among 2,2-bis(3,4-dicarboxyphenyl)hexafluoropropane dianhydride (6FDA), 4-(2,5-dioxotetrahydrofuran-3-yl)-1,2,3,4-tetrahydronaphthalene-1,2-dicarboxylic anhydride (TDA), 4,4'-(4,4'-isopropylidenediphenoxy)bis(phthalic anhydride) (HBDA), 3,3'-(4,4'-oxydiphthalic dianhydride) (ODPA) and 3,4,3',4'-biphenyltetracarboxylic dianhydride (BPDA).

In the embodiment of the invention, the first solvent may comprise one or more selected from among m-cresol, N-methyl-2-pyrrolidone (NMP), dimethylformamide (DMF), dimethylacetamide (DMAc), dimethylsulfoxide (DMSO), acetone and diethylacetate, and the second solvent may comprise one or more selected from among water, an alcohol, an ether, and a ketone.

In the embodiment of the invention, the chemical curing agent may comprise one or more selected from among acetic anhydride (AA), phthalic anhydride (PA), tetrahydrophthalic anhydride (THPA) and methyltetrahydrophthalic anhydride (MTHPA).

In the embodiment of the invention, the imidization catalyst may comprise one or more selected from among isoquinoline, β-picoline, pyridine, triethylamine and dimethylaniline.

In the embodiment of the invention, the diazide-based photosensitive compound may comprise one or more selected from among 2,3,4,4'-tetrahydroxybenzophenone-1,2-naphthoquinonediazide-5-sulfonate, 2,3,4-trihydroxybenzophenone-1,2-naphthoquinonediazide-5-sulfonate and (1-[1-(4-hydroxyphenyl)isopropyl]-4-[1,1-bis(4-hydroxyphenyl)ethyl]benzene)-1,2-naphthoquinonediazide-5-sulfonate.

In the embodiment of the invention, the sensitivity enhancer may comprise one or more selected from among 2,3,4-trihydroxybenzophenone, 2,3,4,4'-tetrahydroxybenzophenone and 1-[1-(4-hydroxyphenyl)isopropyl]-4-[1,1-bis(4-hydroxyphenyl)ethyl]benzene.

In the embodiment of the invention, the positive-type photosensitive resin composition may exhibit a light transmittance of 95% or more.

In the embodiment of the invention, the positive-type photosensitive resin composition may exhibit a dielectric constant of 5 or less.

Another embodiment of the present invention provides an insulating film formed using the above positive-type photosensitive resin composition.

A further embodiment of the present invention provides an organic light emitting diode comprising the above insulating film.

In the embodiment of the invention, the organic light emitting diode may be an active matrix type organic light emitting diode.

Advantageous Effects

The present invention provides a positive-type photosensitive resin composition, and an insulating film and an OLED formed therefrom. Specifically, this composition includes an alkali soluble polyimide resin, a diazide-based photosensitive compound and a sensitivity enhancer, and is advantageous because a polyimide resin in which the degree of imidization of imidized polymer resin is 50~75% is used, thus exhibiting superior developability in a patterning process and a light transmittance of 95% or more in the visible light wavelength range (400~650 nm).

DESCRIPTION OF DRAWINGS

FIG. 1 is an SEM image of a 15 μm resolution pattern taken to inspect the generation of residue upon patterning using a photosensitive resin composition of Example 1; and FIG. 2 is an FT-IR image taken to measure the degree of imidization upon patterning using a photosensitive resin composition of Example 1.

BEST MODE

According to an embodiment of the present invention, a positive-type photosensitive resin composition includes an alkali soluble resin, a diazide-based photosensitive compound and a sensitivity enhancer, wherein the alkali soluble resin is a polyimide resin having a degree of imidization (DI) of 50~75%.

The alkali soluble resin is a polyimide resin obtained by imidizing polyamic acid having a viscosity of 100~700 cps, and its weight average molecular weight (based on GPC measurement) falls in the range of 40,000~80,000 g/mol.

Specifically, the polyimide resin is prepared by polymerizing an aromatic diamine and an aromatic dianhydride in the presence of a first solvent, thus obtaining a polyamic acid solution, imidizing the polyamic acid solution using a chemical curing agent and an imidization catalyst, adding the imidized solution to a second solvent, and performing filtration and drying.

The aromatic diamine is not particularly limited, and may include one or more selected from among 2,2-bis(3-amino-4-hydroxyphenyl)-hexafluoropropane (Bis-AP-AF), 2,2-bis[4-(4-aminophenoxy)-phenyl]propane (6HMDA), 2,2'-bis(trifluoromethyl)-4,4'-diaminobiphenyl (2,2'-TFDB), 3,3'-bis(trifluoromethyl)-4,4'-diaminobiphenyl (3,3'-TFDB), 4,4'-bis(3-aminophenoxy)diphenylsulfone (DBSDA), bis(3-aminophenyl)sulfone (3DDS), bis(4-aminophenyl)sulfone (4DDS), 1,3-bis(3-aminophenoxy)benzene (APB-133), 1,4-bis(4-aminophenoxy)benzene (APB-134), 2,2'-bis[3(3-aminophenoxy)phenyl]hexafluoropropane (3-BDAF), 2,2'-bis[4(4-aminophenoxy)phenyl]hexafluoropropane (4-BDAF) and oxydianiline (ODA). Particularly useful is 2,2-bis(3-amino-4-hydroxyphenyl)-hexafluoropropane (Bis-AP-AF) because of superior light transmittance and heat resistance.

The aromatic dianhydride is not particularly limited, and may include one or more selected from among 2,2-bis(3,4-dicarboxyphenyl)hexafluoropropane dianhydride (6FDA), 4-(2,5-dioxotetrahydrofuran-3-yl)-1,2,3,4-tetrahydronaphthalene-1,2-dicarboxylic anhydride (TDA), 4,4'-(4,4'-isopropylidenediphenoxy)bis(phthalic anhydride) (HBDA), 3,3'-(4,4'-oxydiphthalic dianhydride) (ODPA) and 3,4,3',4'-biphenyltetracarboxylic dianhydride (BPDA). Particularly useful is 2,2-bis(3,4-dicarboxyphenyl)hexafluoropropane dianhydride (6FDA) because of its superior light transmittance and heat resistance.

The aromatic diamine and the aromatic dianhydride may be dissolved at an equimolar ratio in the first solvent and reacted, thus preparing the polyamic acid solution.

The reaction conditions are not particularly limited, but the reaction temperature is preferably set to −20~80° C. and the reaction stirring time is preferably set to 1~48 hr. Also, it is preferred that the reaction environment be an inert environment of argon or nitrogen.

The first solvent for solution polymerization of the monomers is not particularly limited so long as it dissolves polyamic acid.

The first solvent may include one or more polar solvents selected from among N-methyl-2-pyrrolidone (NMP), dimethylformamide (DMF), dimethylacetamide (DMAc), dimethylsulfoxide (DMSO), acetone and diethylacetate, and tetrahydrofuran (THF), chloroform and γ-butyrolactone may be used in addition thereto, but the present invention is not limited thereto.

The amount of the first solvent is not particularly limited, but is 50~95 wt %, preferably 70~90 wt % based on the total amount of the polyamic acid solution in order to impart the appropriate viscosity to the polyamic acid solution.

The polyamic acid solution prepared using the above preparation method has a viscosity of 100~700 cps. If the viscosity of the polyamic acid solution is less than 100 cps, the polymerization reaction time via chemical imidization may decrease, undesirably remarkably lowering the resin yield and photosensitivity. In contrast, if the viscosity thereof is greater than 700 cps, the weight average molecular weight of the polyimide resin is increased to 80,000 g/mol or more, undesirably deteriorating pattern developability.

When the polyamic acid solution is imidized, chemical imidization is applied. Specifically, the polyamic acid solution is imidized in the presence of a chemical curing agent and an imidization catalyst, added to the second solvent, filtered and dried, thus affording solidified polyimide.

The chemical curing agent includes one or more selected from among acetic anhydride (AA), phthalic anhydride (PA), tetrahydrophthalic anhydride (THPA) and methyltetrahydrophthalic anhydride (MTHPA).

The imidization catalyst includes one or more selected from among isoquinoline, β-picoline, pyridine, triethylamine and dimethylaniline.

The second solvent is selected from among solvents to which the principle may be applied of a polyimide resin solid precipitating due to a difference in solubility by using a solvent incapable of dissolving the polyamic acid polymer, and may be a solvent having lower polarity than the first solvent. Specifically, the second solvent may include one or more selected from among water, an alcohol, an ether, and a ketone.

The amount of the second solvent is not particularly limited and is preferably 3~20 parts by weight based on 100 parts by weight of the prepared polyamic acid solution.

The filtration and drying may be conducted under conditions of 80~100° C. and 2~6 hr in consideration of the boiling point of the second solvent and the first solvent which may have been left behind in the solidified polyimide resin.

If the drying temperature of the polyimide resin is lower than 80° C., DI may decrease, undesirably remarkably lowering the dielectric constant and leakage current properties. In contrast, if the drying temperature thereof is higher than 100° C., DI may increase undesirably lowering resolution and transmittance.

The polyimide resin prepared using the above method preferably has a weight average molecular weight (based on GPC measurement) of 40,000~80,000 g/mol. The case where the weight average molecular weight of the polyimide resin falls in the above range may achieve good resolution in a patterning process.

When a photodegradable transfer material including the polyimide resin has a coating thickness of 1.0~2.0 μm, it may manifest light transmittance at a wavelength of 550 nm. As such, light transmittance may be 85% or more, particularly 90~95%.

If the light transmittance of the photodegradable transfer material at 550 nm is less than 85%, sensitivity may decrease in a photolithography process and thus a residue may be left behind and insulating properties may be deteriorated.

The weight average molecular weight as used herein is defined as a calculated value of polystyrene equivalent, as determined by gel permeation chromatography (GPC).

The diazide-based photosensitive compound may be synthesized via esterification of a polyhydroxy compound and a quinonediazide sulfonic acid compound. The esterification for obtaining the diazide-based photosensitive compound may be conducted in such a manner that a polyhydroxy compound and a quinonediazide sulfonic acid compound are condensed using a basic catalyst such as dioxane, acetone, tetrahydrofuran, methylethylketone, N-methylpyrrolidone, chloroform, triethylamine, N-methylmorpholine, N-methylpiperazine or 4-dimethylaminopyridine to form a product which is then cleaned, purified and dried.

Examples of the quinonediazide sulfonic acid compound may include o-quinonediazide sulfonic acid compounds such as 1,2-benzoquinone diazide-4-sulfonic acid, 1,2-naphthoquinone diazide-4-sulfonic acid, 1,2-benzoquinone diazide-5-sulfonic acid and 1,2-naphthoquinone diazide-5-sulfonic acid, and the other quinonediazide sulfonic acid derivatives.

The quinonediazide sulfonic acid compound functions as a dissolution inhibitor which decreases the solubility of the alkali soluble resin. However, upon photo exposure, this compound may rather promote the dissolution of the alkali soluble resin in an alkali because of its alkali solubility.

Examples of the polyhydroxy compound may include trihydroxy benzophenones such as 2,3,4-trihydroxy benzophenone, 2,2',3-trihydroxy benzophenone, 2,3,4'-trihydroxy benzophenone, etc.; tetrahydroxy benzophenones such as 2,3,4,4'-tetrahydroxy benzophenone, 2,2',4,4'-tetrahydroxy benzophenone, 2,3,4,5-tetrahydroxy benzophenone and so on; pentahydroxy benzophenones such as 2,2',3,4,4'-pentahydroxy benzophenone, 2,2',3,4,5-pentahydroxy benzophenone and so on; hexahydroxy benzophenones such as 2,3,3',4,4',5'-hexahydroxy benzophenone, 2,2',3,3',4,5'-hexahydroxy benzophenone and so on; gallic acid alkyl esters; oxyflavones, etc.

The diazide-based photosensitive compound obtained therefrom may include one or more selected from among 2,3,4,4'-tetrahydroxybenzophenone-1,2-naphthoguinonediazide-5-sulfonate, 2,3,4-trihydroxybenzophenone-1,2-naphthoguinonediazide-5-sulfonate and (1-[1-(4-hydroxyphenyl)isopropyl]-4-[1,1-bis(4-hydroxyphenyl)ethyl]benzene)-1,2-naphthoguinonediazide-5-sulfonate.

The amount of the diazide-based photosensitive compound may be 30~80 parts by weight based on 100 parts by weight of the alkali soluble resin in terms of developability or solubility. If the amount of the diazide-based photosensitive compound is less than 30 parts by weight based on 100 parts by weight of the alkali soluble resin, the resolution may become problematic and thus residue may be left behind. In contrast, if the amount thereof is greater than 80 parts by weight, the solubility may decrease upon preparation of a solution, undesirably causing problems of extended storage stability and transmittance.

The diazide-based photosensitive compound is used as a dissolution inhibitor which decreases the solubility of the alkali soluble resin in an alkali, and is converted into an alkali soluble material when irradiated with light, thus increasing the alkali solubility of the alkali soluble resin. When the solubility is changed due to light radiation in this way, the exposed portion of the positive-type photosensitive resin composition of the invention is developed.

The sensitivity enhancer is used to enhance sensitivity, and may include one or more selected from among 2,3,4-trihydroxybenzophenone, 2,3,4,4'-tetrahydroxybenzophenone and 1-[1-(4-hydroxyphenyl)isopropyl]-4-[1,1-bis(4-hydroxyphenyl)ethyl]benzene.

The amount of the sensitivity enhancer may be 3~15 parts by weight based on 100 parts by weight of the alkali soluble resin in terms of photosensitive effects and window process margin.

Meanwhile, insulation resistance may be represented by a dielectric constant when the coating thickness of the positive-type photosensitive resin composition is 1.0~2.0 μm. An insulating film having a dielectric constant of 5 or less is preferable.

Also, the positive-type photosensitive resin composition according to the embodiment of the invention may include an additive such as a leveling agent such as silicone, a filler, an antioxidant, etc., and such an additive may be arbitrarily selected from among materials widely used in the art.

When the composition comprising the polyimide resin as the alkali soluble resin, the diazide-based photosensitive compound and the sensitivity enhancer is dispersed in a predetermined amount of solvent, a positive-type photosensitive resin composition according to an embodiment of the invention may be obtained.

The solvent used herein may include one or more selected from among ethyl acetate, butyl acetate, ethyleneglycol monoethylether acetate, diethyleneglycol monoethylether acetate, propyleneglycol monoethylether acetate, propyleneglycol monomethylether acetate, acetone, methylethylketone, ethyl alcohol, methyl alcohol, propyl alcohol, isopropyl alcohol, benzene, toluene, cyclopentanone, cyclohexanone, ethyleneglycol, xylene, ethyleneglycol monoethylether and diethyleneglycol monoethylether.

According to another embodiment of the invention, an insulating film is provided, which is formed from the positive-type photosensitive resin composition mentioned above.

In the invention, forming insulating layer of an OLED using the positive-type photosensitive resin composition is described below. The above components are made into a solution which is then applied on the surface of a substrate, followed by prebaking the substrate, thus forming a film. The coating process is performed using a spin coater, and prebaking conditions may vary depending on the ratio of the composition but is typically carried out using a hot plate at 90~120° C. for 1~10 min. The coating thickness is adjusted to fall in the range of 1.0~2.0 μm. Subsequently, a mask is positioned on the prebaked coating film, UV light is applied thereto, and a developing process is performed using an alkali aqueous solution to remove unnecessary portions, thus forming a pattern. The photo exposure amount is determined depending on the resolution, and the developing solution is an alkali aqueous solution such as inorganic alkali such as sodium hydroxide, potassium hydroxide, sodium silicate, ammonia or the like. In particular, developing is conducted using a 2.38% tetramethyl ammonium hydroxide (TMAH) aqueous solution for about 60~180 sec. The developing process may be performed using spraying, dipping, etc. This pattern is subjected to postbaking using a hot plate, thus completing an insulating film. As such, postbaking is preferably conducted via heating at 150~260° C. for about 4~60 min.

In the invention, the insulating film formed from the positive-type photosensitive resin composition may exhibit not only superior pattern developability and light transmittance but also insulation resistance because of the use of the improved polyimide resin.

According to a further embodiment of the invention, an OLED is provided, which includes the above insulating film.

The method of manufacturing the OLED is not particularly limited, but may be as follows.

A transparent substrate having a transparent electrode such as ITO deposited thereon is coated with a photoresist, followed by performing photo exposure, developing, etching, stripping etc. to form a pattern, and an insulating layer is then formed via the above-mentioned procedure, and a barrier is formed again on the insulating layer pattern. Thereafter, an organic thin film is deposited in the order of an electron injection layer, an electron transport layer, a light emitting layer, a hole transport layer and a hole injection layer, and a metal electrode layer is then deposited thereon. Finally, sealing is conducted using a sealant and a module is then assembled thus manufacturing an OLED.

The positive-type photosensitive resin composition of the invention is referred to as a positive type meaning that it is insoluble or is difficult to dissolve in an alkali developing solution due to the dissolution inhibition action of the diazide-based photosensitive compound before photo exposure but may be dissolved in the alkali developing solution by converting the diazide-based photosensitive compound after photo exposure.

The OLED having the insulating film formed from the positive-type photosensitive resin composition of the invention is an active matrix type OLED.

A better understanding of the present invention may be obtained from the following examples and comparative example. However, such examples and comparative examples are set forth to illustrate, but are not to be construed as limiting the present invention.

Example 1 a. Polymerization of Polyimide Resin

While a 100 ml 3-neck round bottom flask reactor equipped with a stirrer, a nitrogen inlet, a dropping funnel, a temperature controller and a condenser was purged with nitrogen, 81.051 g of N,N-dimethylacetamide (DMAc) was added, the temperature of the reactor was decreased to 0° C., 9.1565 g (0.25 mol) of Bis-AP-AF was dissolved, and the resulting solution was maintained at 0° C. Furthermore, 11.10625 g (0.25 mol) of 6FDA was added thereto, and the reaction mixture was stirred for 1 hr to completely dissolve 6FDA. As such, the solid content was 20 wt %, and the solution was allowed to stand at room temperature and stirred for 1 hr. Thereby, a polyamic acid solution having a viscosity of 470 cps at 23° C. was obtained.

To this polyamic acid solution, acetic anhydride (available from Samchun) as a chemical curing agent and pyridine (available from Samchun) were respectively added in amounts of 2 equivalents. The polyamic acid solution was then stirred at 80° C. for 1 hr to imidize it, after which 30 g of the imidized solution was added to 300 g of water so that precipitation took place. The precipitated solid was filtered and milled to obtain fine powder, which was then dried in a vacuum oven at 100° C. for 6 hr, yielding about 18 g of resin solid powder (weight average molecular weight of imidized resin: 48,000 g/mol).

b. Preparation of Photosensitive Resin Composition 100 parts by weight of the prepared polyimide resin (wherein the viscosity of the polyamic acid solution as the polymerization intermediate was 470 cps, and the weight average molecular weight of the imidized resin was 48,000 g/mol) was mixed with 50 parts by weight of a photosensitive compound ((1-[1-(4-hydroxyphenyl)isopropyl]-4-[1,1-bis(4-hydroxyphenyl)ethyl]benzene)-1,2-naphthoquinonediazide-5-sulfonate), 12.5 parts by weight of a sensitivity enhancer (1-[1-(4-hydroxyphenyl)isopropyl]-4-[1,1-bis(4-hydroxyphenyl)ethyl]benzene), 660 parts by weight of a solvent (propyleneglycol monomethylether acetate), and 4.2 parts by weight of a silicone additive as a leveling agent, and stirred for 2 hr, thus preparing a photosensitive resin composition.

<Evaluation of Resolution>

The photosensitive resin composition prepared as above was applied to a thickness of 3.0 μm on an ITO substrate using spin coating, prebaked on a hot plate at 120° C. for 100 sec, and dried, thus forming a coating film having a thickness of 1.5±0.05 μm. The substrate was irradiated with UV light at 80 mJ/cm² using a photomask, developed in a 2.38% TMAH alkali developing solution for 60 sec, and washed with water for 40 sec, so that non-exposed portions were left behind, thus forming a circuit. At this time, the resolution was observed using SEM (final thickness 1.5 μm).

<Evaluation of Residue Generation>

A circuit was formed in the same manner as in the above evaluation of the resolution, and whether developing was possible without residue generation in a 15 μm resolution pattern was observed with SEM.

<Evaluation of Imidization>

The polyimide resin was prepared to a 50% solution in N,N-dimethylacetamide (DMAc), after which this solution was applied on an ITO substrate (50 mm×50 mm) using spin coating, after which respective samples were cured in an oven at 100° C., 150° C., 200° C., 250° C., 300° C. for 30 min and thus FT-IR spectrum was obtained at each temperature. Typically, in the spectrum measurement results, the integration ratio of relative peaks at 1370 cm$^{-1}$ derived from polyimide C—N—C and 1496 cm$^{-1}$ derived from the benzene ring was measured, and substituted into the following equation to calculate the degree of imidization (DI). As such, the absorption intensity ratio was calculated at 300° C. for 30 min corresponding to 100% imidization conditions.

$$DI(\%) = \frac{[V_{C-N\,stretching}(1370\,cm^{-1})]/[V_{aromatic}(1496\,cm^{-1})]\Big|_{sample}}{[V_{C-N\,stretching}(1370\,cm^{-1})]/[V_{aromatic}(1496\,cm^{-1})]\Big|_{100\%\,imidization}} \times 100$$

<Evaluation of Light Transmittance>

The photosensitive resin composition prepared as above was applied to a thickness of 3.0 μm on an ITO substrate using spin coating, prebaked on a hot plate at 120° C. for 90 sec and dried, thus forming a coating film having a thickness of 1.5±0.05 μm after which light transmittance was measured at 550 nm using a recording spectrophotometer (UV-3101PC, SHIMADZU).

<Evaluation of Dielectric Constant>

The photosensitive resin composition prepared as above was applied to a thickness of 3.0 μm on an ITO substrate using spin coating, prebaked on a hot plate at 120° C. for 100 sec and dried, thus forming a coating film having a thickness of 1.5±0.05 μm. This substrate was irradiated with UV light at 40~80 mJ/cm² using a photomask, developed in a 2.38% TMAH alkali developing solution for 60 sec, washed with water for 40 sec, and heated on a hot plate at 230° C. for 1 hr, thus forming an insulating film (final thickness 1.5 μm). Then a metal electrode (Al) was deposited to a thickness of 2,000 Å on the insulating film (deposition machine: Thermal Evaporator Model E306). The dielectric constant was measured using a precision impedance analyzer (Model: 4294A, HP).

<Evaluation of Leakage Current>

The leaked current was measured via current flow of the manufactured OLED using a leakage current meter (available from JM Tech).

<Evaluation of Luminance>

The luminance of the manufactured OLED was measured using a luminance meter (available from Minolta).

Comparative Example 1 a. Polymerization of Polyimide Resin

A polyimide resin having the same composition as in Example 1 was prepared, with the exception that 6FDA was completely dissolved and then the solution was allowed to stand at room temperature and stirred for 1.5 hr. Thereby, a polyamic acid solution having a viscosity of 750 cps at 23° C. was obtained.

To this polyamic acid solution, acetic anhydride (available from Samchun) as a chemical curing agent and pyridine (available from Samchun) were respectively added in amounts of 2 equivalents. The polyamic acid solution was then stirred at 80° C. for 1 hr to imidize it, after which 30 g of the imidized solution was added to 300 g of water so that precipitation took place. The precipitated solid was filtered and milled to obtain fine powder, which was then dried in a vacuum oven at 120° C. for 6 hr, yielding about 16 g of resin solid powder (weight average molecular weight of imidized resin: 65,000 g/mol).

b. Preparation of Photosensitive Resin Composition

The formation of an insulating film using the photosensitive resin composition having the same composition as in Example 1 and the evaluation thereof were performed in the same manner as in Example 1.

Comparative Example 2 a. Polymerization of Polyimide Resin

A polyimide resin having the same composition as in Example 1 was prepared, with the exception that 6FDA was completely dissolved and then the solution was allowed to stand at room temperature and stirred for 50 min. Thereby, a polyamic acid solution having a viscosity of 300 cps at 23° C. was obtained.

To this polyamic acid solution, acetic anhydride (available from Samchun) as a chemical curing agent and pyridine (available from Samchun) were respectively added in amounts of 2 equivalents, after which the polyamic acid solution was stirred at 80° C. for 1 hr to imidize it, and then 30 g of the imidized solution was added to 300 g of water so that precipitation took place. The precipitated solid was filtered and milled to obtain fine powder, which was then dried in a vacuum oven at 60° C. for 6 hr, yielding about 18 g of resin solid powder (weight average molecular weight of imidized resin: 38,000 g/mol).

b. Preparation of Photosensitive Resin Composition

The formation of an insulating film using the photosensitive resin composition having the same composition as in Example 1 and the evaluation thereof were performed in the same manner as in Example 1.

Comparative Example 3 a. Polymerization of Polyimide Resin

A polyimide resin having the same composition as in Example 1 was prepared, with the exception that 6FDA was completely dissolved and then the solution was allowed to stand at room temperature and stirred for 2 hr. Thereby, a polyamic acid solution having a viscosity of 900 cps at 23° C. was obtained.

To this polyamic acid solution there was added 2 equivalents each of a chemical curing agent, that is, acetic anhydride (available from Samchun) and pyridine (available from Samchun). The polyamic acid solution was then stirred at 80° C. for 1 hr to imidize it, after which 30 g of the imidized solution was added to 300 g of water so that precipitation took place. The precipitated solid was filtered and milled to obtain fine powder, which was then dried in a vacuum oven at 120° C. for 6 hr, yielding about 18 g of resin solid powder (weight average molecular weight of imidized resin: 100,000 g/mol).

b. Preparation of Photosensitive Resin Composition

The formation of an insulating film using the photosensitive resin composition having the same composition as in Example 1 and the evaluation thereof were performed in the same manner as in Example 1.

Comparative Example 4

12 wt % of a novolac resin (this novolac resin was comprised of a cresol formaldehyde novolac resin, a meta/para cresol ratio of 4:6 by weight, a cresol novolac resin comprising a cresol novolac resin having a weight average molecular weight of 8,000 and a cresol novolac resin having a weight average molecular weight of 2,000 mixed at a weight ratio of 7:3), 6 wt % of a photosensitive compound ((1-[1-(4-hydroxyphenyl)isopropyl]-4-[1,1-bis(4-hydroxyphenyl)ethyl]benzene)-1,2-naphthoquinonediazide-5-sulfonate), 80 wt % of a solvent (propyleneglycol monomethylether acetate), 1.5 wt % of a sensitivity enhancer (1-[1-(4-hydroxyphenyl)isopropyl]-4-[1,1-bis(4-hydroxyphenyl)ethyl]benzene), and 0.5 wt % of a silicone additive as a leveling agent were mixed and stirred for 2 hr, thus preparing a photosensitive resin composition.

The formation of an insulating film using the photosensitive resin composition and the evaluation thereof were performed in the same manner as in Example 1.

TABLE 1

|  | Ex. 1 | Comp. Ex. 1 | Comp. Ex. 2 | Comp. Ex. 3 | Comp. Ex. 4 |
| --- | --- | --- | --- | --- | --- |
| Resolution (μm) | 12 | 22 | 18 | 24 | 14 |
| Residue generation | x | ◦ | x | ◦ | x |
| DI (%) | 65 | 80 | 40 | 83 | — |
| Light transmittance (%) | 96.5 | 82.4 | 86.1 | 79.1 | 84.3 |
| Dielectric constant | 3.6 | 4.0 | 4.5 | 4.3 | 4.8 |
| Leakage current (nA) | 330.4 | 410.1 | 411.9 | 470.1 | 379.8 |
| Luminance (cd/m$^2$) | 542.3 | 402.1 | 400.8 | 440.0 | 440.7 |

As is apparent from Table 1, the insulating film obtained from the photosensitive resin composition can form a pattern having high resolution and light transmittance because of the use of the improved polyimide resin. In Example 1, the polyamic acid solution which is a resin precursor had an appropriate DI because of the proper polymerization viscosity and molecular weight, so that the desired resolution and light transmittance could be obtained. In Comparative Examples 1 to 3 in which the DI of the polyamic acid solution falls outside of the proper range, the desired resolution and light transmittance could not be obtained. Also leakage current and luminance were decreased. In Comparative Example 4 in which the polyimide resin satisfying the above conditions is not included, the desired resolution, insulating properties and optical properties could not be attained.

FIG. 1 is an SEM image of a 15 μm resolution pattern taken to observe the generation of residue upon patterning using the photosensitive resin composition of Example 1. As illustrated in FIG. 1, there was no residue on the exposed portion and the boundary between the exposed portion and the non-exposed portion.

FIG. 2 is an FT-IR image taken to measure the DI upon patterning using the photosensitive resin composition of Example 1. As illustrated in the spectrum of FIG. 2, the DI was calculated from the integration ratio of relative peaks at 1370 cm$^{-1}$ derived from polyimide C—N—C and 1496 cm$^{-1}$ derived from the benzene ring.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. A positive-type photosensitive resin composition, comprising an alkali soluble resin, a diazide-based photosensitive compound, and a sensitivity enhancer,
   wherein the alkali soluble resin is a polyimide resin having a degree of imidization of 50-65% and having a weight average molecular weight of 40,000-80,000 g/mol, as measured by gel permeation chromatography;
   wherein the polyimide resin is an imide of a polyamic acid formed from an aromatic diamine and an aromatic dianhydride;
   wherein the aromatic diamine comprises 2,2-bis(3-amino-4-hydroxyphenyl)-hexafluoropropane and the aromatic dianhydride comprises 2,2-bis(3,4-dicarboxyphenyl) hexafluoropropane dianhydride; and
   wherein the polyamic acid is in a solution form which has a viscosity of 100-700 cps.

2. The positive-type photosensitive resin composition of claim 1, wherein the polyimide resin is prepared by
   polymerizing the aromatic diamine and the aromatic dianhydride using a first solvent to obtain a polyamic acid solution;
   imidizing the polyamic acid solution using a chemical curing agent and an imidization catalyst to obtain an imidized solution;
   adding the imidized solution to a second solvent; and
   performing filtration and drying to give the polyimide resin.

3. The positive-type photosensitive resin composition of claim 1, wherein the aromatic diamine further comprises one or more selected from the group consisting of 2,2-bis[4-(4-aminophenoxy)-phenyl]propane, 2,2'-bis(trifluoromethyl)-4,4'-diaminobiphenyl, 3,3'-bis(trifluoromethyl)-4,4'-diaminobiphenyl, 4,4'-bis(3-aminophenoxy)diphenylsulfone, bis(3-aminophenyl) sulfone, bis(4-aminophenyl)sulfone, 1,3-bis(3-aminophenoxy)benzene, 1,4-bis(4-aminophenoxy)benzene, 2,2'-bis[3(3-aminophenoxy)phenyl] hexafluoropropane, 2,2'-bis[4(4-aminophenoxy)phenyl] hexafluoropropane, and oxydianiline.

4. The positive-type photosensitive resin composition of claim 1, wherein the aromatic dianhydride further comprises one or more selected from the group consisting of 4-(2,5-dioxotetrahydrofuran-3-yl)-1,2,3,4-tetrahydronaphthalene-1,2-dicarboxylic anhydride, 4,4'-(4,4'-isopropylidenediphenoxy)bis(phthalic anhydride), 3,3'-(4,4'-oxydiphthalic dianhydride), and 3,4,3',4'-biphenyltetracarboxylic dianhydride.

5. The positive-type photosensitive resin composition of claim 2, wherein the first solvent comprises one or more selected from the group consisting of m-cresol, N-methyl-2-pyrrolidone, dimethylformamide, dimethylacetamide, dimethylsulfoxide, acetone, and diethylacetate, and the second solvent comprises one or more selected from the group consisting of water, an alcohol, an ether, and a ketone.

6. The positive-type photosensitive resin composition of claim 2, wherein the chemical curing agent comprises one or more selected from the group consisting of acetic anhydride, phthalic anhydride, tetrahydrophthalic anhydride, and methyltetrahydrophthalic anhydride.

7. The positive-type photosensitive resin composition of claim 2, wherein the imidization catalyst comprises one or more selected from the group consisting of isoquinoline, β-picoline, pyridine, triethylamine, and dimethylaniline.

8. The positive-type photosensitive resin composition of claim 1, wherein the diazide-based photosensitive compound comprises one or more selected from the group consisting of 2,3,4,4'-tetrahydroxybenzophenone-1,2-naphthoquinonediazide-5-sulfonate, 2,3,4 trihydroxybenzophenone-1,2-naphthoquinonediazide-5-sulfonate, and (1-[1-(4-hydroxyphenyl)isopropyl]-4-[1,1-bis(4-hydroxyphenyl) ethyl]benzene)-1,2-naphthoquinonediazide-5-sulfonate.

9. The positive-type photosensitive resin composition of claim 1, wherein the sensitivity enhancer comprises one or more selected from the group consisting of 2,3,4-trihydroxybenzophenone, 2,3,4,4'-tetrahydroxybenzophenone and 1-[1-(4-hydroxyphenyl)isopropyl]-4-[1,1-bis(4-hydroxyphenyl)ethyl]benzene.

10. The positive-type photosensitive resin composition of claim 1, which exhibits a light transmittance of 95% or more.

11. The positive-type photosensitive resin composition of claim 1, which exhibits a dielectric constant of 5 or less.

12. An insulating film comprising the positive-type photosensitive resin composition of claim 1.

13. An organic light emitting diode comprising the insulating film of claim 12.

14. The organic light emitting diode of claim 13, which is an active matrix type organic light emitting diode.

* * * * *